(12) United States Patent
Baluja et al.

(10) Patent No.: US 12,158,367 B2
(45) Date of Patent: Dec. 3, 2024

(54) SYSTEMS AND METHODS FOR ENHANCED VIBRATION AND ELECTRICAL NOISE PERFORMANCE IN MAGNETOSTRICTIVE TRANSMITTERS

(71) Applicant: ABB Schweiz AG, Baden (CH)

(72) Inventors: Wilfredo Fernando Baluja, Warminster, PA (US); Besson-Yasong Yu, Shanghai (CN)

(73) Assignee: ABB Schweiz AG, Baden (CH)

( * ) Notice: Subject to any disclaimer, the term of this patent is extended or adjusted under 35 U.S.C. 154(b) by 436 days.

(21) Appl. No.: 17/476,222

(22) Filed: Sep. 15, 2021

(65) Prior Publication Data
US 2023/0082701 A1 Mar. 16, 2023

(51) Int. Cl.
*G01F 23/72* (2006.01)
*G01B 7/00* (2006.01)
(Continued)

(52) U.S. Cl.
CPC ............ *G01F 23/72* (2013.01); *G01B 7/003* (2013.01); *H03F 3/04* (2013.01); *H03G 3/30* (2013.01);
(Continued)

(58) Field of Classification Search
CPC . G01F 23/72; G01B 7/003; H03F 3/04; H03F 3/30; H03F 2200/171; H03F 2200/261; H03G 2201/103
See application file for complete search history.

(56) References Cited

U.S. PATENT DOCUMENTS

| 5,473,245 A | 12/1995 | Silvus, Jr. et al. |
| 5,924,980 A * | 7/1999 | Coetzee ............. A61B 5/14551 600/300 |

(Continued)

FOREIGN PATENT DOCUMENTS

| AU | 2004269176 A1 | 3/2005 |
| CN | 101571438 A | 11/2009 |

(Continued)

OTHER PUBLICATIONS

Extended European Search Report for European Application No. 22195927.3, dated Jan. 26, 2023, 9 pages.

*Primary Examiner* — Jennifer Bahls
*Assistant Examiner* — Quang X Nguyen
(74) *Attorney, Agent, or Firm* — McCarter & English, LLP

(57) ABSTRACT

Illustrative embodiments of systems and methods for enhanced vibration and electrical noise performance in magnetostrictive transmitters are disclosed. In one embodiment, a signal conditioning circuit may comprise an instrumentation amplifier configured to receive and amplify an analog measurement signal, an active high pass filter configured to reduce noise in a signal output by the instrumentation amplifier, a variable gain amplifier stage configured to further amplify a signal output by the active high pass filter, a distance detection module configured to process a signal output by the variable gain amplifier stage to determine a distance measurement associated with the analog measurement signal received by the instrumentation amplifier, and a programmable control circuit configured to control a gain level of the variable gain amplifier stage and to receive data concerning the signal output by the variable gain amplifier stage, including the distance measurement, from the distance detection module.

18 Claims, 5 Drawing Sheets

(51) Int. Cl.
*H03F 3/04* (2006.01)
*H03G 3/30* (2006.01)

(52) U.S. Cl.
CPC .. *H03F 2200/171* (2013.01); *H03F 2200/261* (2013.01); *H03G 2201/103* (2013.01)

(56) References Cited

U.S. PATENT DOCUMENTS

| | | | |
|---|---|---|---|
| 5,949,273 | A | 9/1999 | Mourick et al. |
| 6,373,907 | B1* | 4/2002 | Katsura ............... H03G 3/3068 375/345 |
| 7,780,155 | B2 | 8/2010 | Capdepuy et al. |
| 9,541,428 | B2 | 1/2017 | Fink et al. |
| 10,411,678 | B2 | 9/2019 | Wu |
| 2010/0037673 | A1* | 2/2010 | Wicht ..................... H04Q 9/00 73/1.73 |
| 2012/0007744 | A1* | 1/2012 | Pal ........................ G01M 3/243 702/51 |
| 2012/0036927 | A1 | 2/2012 | Sanders |
| 2012/0289809 | A1* | 11/2012 | Kaib ..................... A61B 5/316 600/388 |
| 2015/0177206 | A1 | 6/2015 | Basham et al. |

FOREIGN PATENT DOCUMENTS

| | | | | |
|---|---|---|---|---|
| CN | 207688975 | U | 8/2018 | |
| CN | 110017883 | A | 7/2019 | |
| CN | 209131779 | U | 7/2019 | |
| CN | 209764208 | U | 12/2019 | |
| CN | 111044095 | A * | 4/2020 | ............ G01D 21/02 |
| CN | 211696615 | U | 10/2020 | |
| CN | 113008338 | A | 6/2021 | |
| EP | 2797228 | A1 | 10/2014 | |
| EP | 2893299 | A1 | 7/2015 | |
| JP | H06250670 | A * | 9/1994 | |
| JP | H0832057 | B2 * | 3/1996 | |
| JP | H09280971 | A | 10/1997 | |
| JP | 3868066 | B2 | 1/2007 | |
| WO | 2010019427 | A2 | 2/2010 | |
| WO | 2012135028 | A1 | 10/2012 | |

* cited by examiner

SYSTEMS AND METHODS FOR ENHANCED VIBRATION AND ELECTRICAL NOISE PERFORMANCE IN MAGNETOSTRICTIVE TRANSMITTERS

TECHNICAL FIELD

The present subject matter relates to magnetostrictive transmitters, and more particularly, to systems and methods for enhanced vibration and electrical noise performance in magnetostrictive transmitters.

BACKGROUND

Magnetostrictive technology is usually sensitive to vibration. Vibrations can trigger unwanted electrical pulses from magnetostrictive sensors that can be misinterpreted by detection circuits. Most existing magnetostrictive instruments suffer from such vibration sensitivity, which is typically addressed by steadily securing the magnetostrictive transmitters during use, or even using vibration isolators.

Additionally, some configurations offered with magnetostrictive transmitters require interconnecting components between the magnetostrictive sensors and the detection circuits. Intrinsic capacitance coupling between these interconnecting components and power supplies or large rotating electrical machines located in the proximity of the magnetostrictive transmitter can generate significant electromagnetic noise in the small signal from the magnetostrictive sensor.

The description provided in the background section should not be assumed to be prior art merely because it is mentioned in or associated with the background section. The background section may include information that describes one or more aspects of the subject technology.

SUMMARY

According to one aspect, a signal conditioning circuit may comprise an instrumentation amplifier configured to receive and amplify an analog measurement signal, an active high pass filter configured to reduce noise in a signal output by the instrumentation amplifier, a variable gain amplifier stage configured to further amplify a signal output by the active high pass filter, a distance detection module configured to process a signal output by the variable gain amplifier stage to determine a distance measurement associated with the analog measurement signal received by the instrumentation amplifier, and a programmable control circuit configured to control a gain level of the variable gain amplifier stage and to receive data concerning the signal output by the variable gain amplifier stage, including the distance measurement, from the distance detection module.

In some embodiments, the signal conditioning circuit may further comprise an analog-to-digital converter (ADC) configured to sample the signal output by the variable gain amplifier stage to generate a digitized measurement signal.

In some embodiments, the signal conditioning circuit may further comprise a human-machine interface configured to display a plot of the digitized measurement signal.

In some embodiments, the programmable control circuit may be further configured to receive the digitized measurement signal from the ADC.

In some embodiments, the programmable control circuit may be further configured to implement a median filter to remove spikes from the distance measurement.

In some embodiments, the programmable control circuit may be further configured to apply a diagnostic algorithm to the data received from the distance detection module, wherein the diagnostic algorithm generates diagnostic messages in response to determining that diagnostic criteria are met.

In some embodiments, the signal conditioning circuit may further comprise a human-machine interface configured to display the diagnostic messages generated by the diagnostic algorithm of the programmable control circuit.

In some embodiments, the signal conditioning circuit may further comprise a pulsing circuit configured to generate a current pulse in response to a control signal received from the programmable control circuit, wherein the analog measurement signal received by the instrumentation amplifier results from the current pulse.

In some embodiments, the programmable control circuit may be further configured to adjust the control signal to set an energy level of the current pulse as high as possible without causing saturation in the signal output by the variable gain amplifier stage.

In some embodiments, the programmable control circuit may be further configured to set the gain level of the variable gain amplifier stage, after setting the energy level of the current pulse, to be as high as possible without causing saturation in the signal output by the variable gain amplifier stage.

In some embodiments, the active high pass filter may be a Bessel filter with a normalized transfer function of up to −80 dB at 50 Hz and −54 dB at 500 Hz.

In some embodiments, the signal conditioning circuit may further comprise a polarity selection circuit configured to selectively switch a polarity of the signal output by the active high pass filter, in response to control signals from the programmable control circuit, before that signal is provided to the variable gain amplifier stage.

In some embodiments, the the variable gain amplifier stage may provide up to 48 dB of dynamic range.

In some embodiments, the instrumentation amplifier, the active high pass filter, and the variable gain amplifier stage may collectively provide gain up to 90 dB for frequencies between 17 KHz and 40 KHz and attenuation down to −90 db for frequencies between 50 Hz and 60 Hz.

In some embodiments, the distance detection module may comprise a threshold circuit configured to generate a threshold voltage in response to a control signal received from the programmable control circuit, a threshold crossing detector configured to compare the signal output by the variable gain amplifier stage to the threshold voltage, a zero crossing detector configured to compare the signal output by the variable gain amplifier stage to ground, and a distance detecting circuit configured to determine the distance measurement using signals output by the threshold crossing detector and the zero crossing detector.

In some embodiments, the programmable control circuit may be further configured to adjust the control signal sent to the threshold circuit such that the threshold voltage is set midway between (i) a highest amplitude in the signal output by the variable gain amplifier stage representing signal of interest and (ii) a highest amplitude in the signal output by the variable gain amplifier stage representing noise.

According to another aspect, a magnetostrictive transmitter may comprise a signal conditioning circuit with any or all of the features described above, a sensor tube containing a wire, wherein the current pulse generated by the pulsing circuit travels along the wire, a magnetic float configured to move along the sensor tube and to induce a torsional stress wave in the wire in response to a magnetic field created by the current pulse travelling along the wire, and a sensor configured to generate the analog measurement signal in response to the torsional stress wave.

According to yet another aspect, a method of configuring a magnetostrictive level transmitter may comprise transmitting a current pulse along a wire to cause a magnetic float to induce a torsional stress wave in the wire in response to a magnetic field created by the current pulse, generating an analog measurement signal in response to the torsional stress wave, amplifying the analog measurement signal to produce an amplified measurement signal, iteratively repeating the transmitting, generating, and amplifying steps while incrementally increasing an energy level of the current pulse, until saturation is observed in the amplified measurement signal, and setting the energy level of the current pulse at a highest value that did not cause saturation in the amplified measurement signal.

In some embodiments, the method may further comprise (after setting the energy level of the current pulse) iteratively repeating the transmitting, generating, and amplifying steps while incrementally increasing a gain level of a variable gain amplifier stage used to amplify the analog measurement signal, until saturation is observed in the amplified measurement signal, and setting the gain level of the variable gain amplifier stage at a highest value that did not cause saturation in the amplified measurement signal.

In some embodiments, the method may further comprise generating a threshold voltage that is midway between (i) a highest amplitude in the amplified measurement signal that represents signal of interest and (ii) a highest amplitude in the amplified measurement signal that represents noise, and comparing the amplified measurement signal to threshold voltage using a threshold crossing detector to filter out the noise from the signal of interest when determining a distance represented by the analog measurement signal.

Other aspects and advantages of the present invention will become apparent upon consideration of the following detailed description and the attached drawings wherein like numerals designate like structures throughout the specification.

BRIEF DESCRIPTION OF THE DRAWINGS

The detailed description below refers to the appended drawings, in which.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject matter disclosed.

DETAILED DESCRIPTION OF THE DRAWINGS

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Still further, modules and processes depicted may be combined, in whole or in part, and/or divided, into one or more different parts, as applicable to fit particular implementations without departing from the scope of the present disclosure. Accordingly, the drawings and description are to be regarded as illustrative in nature and not restrictive.

Figure 1:
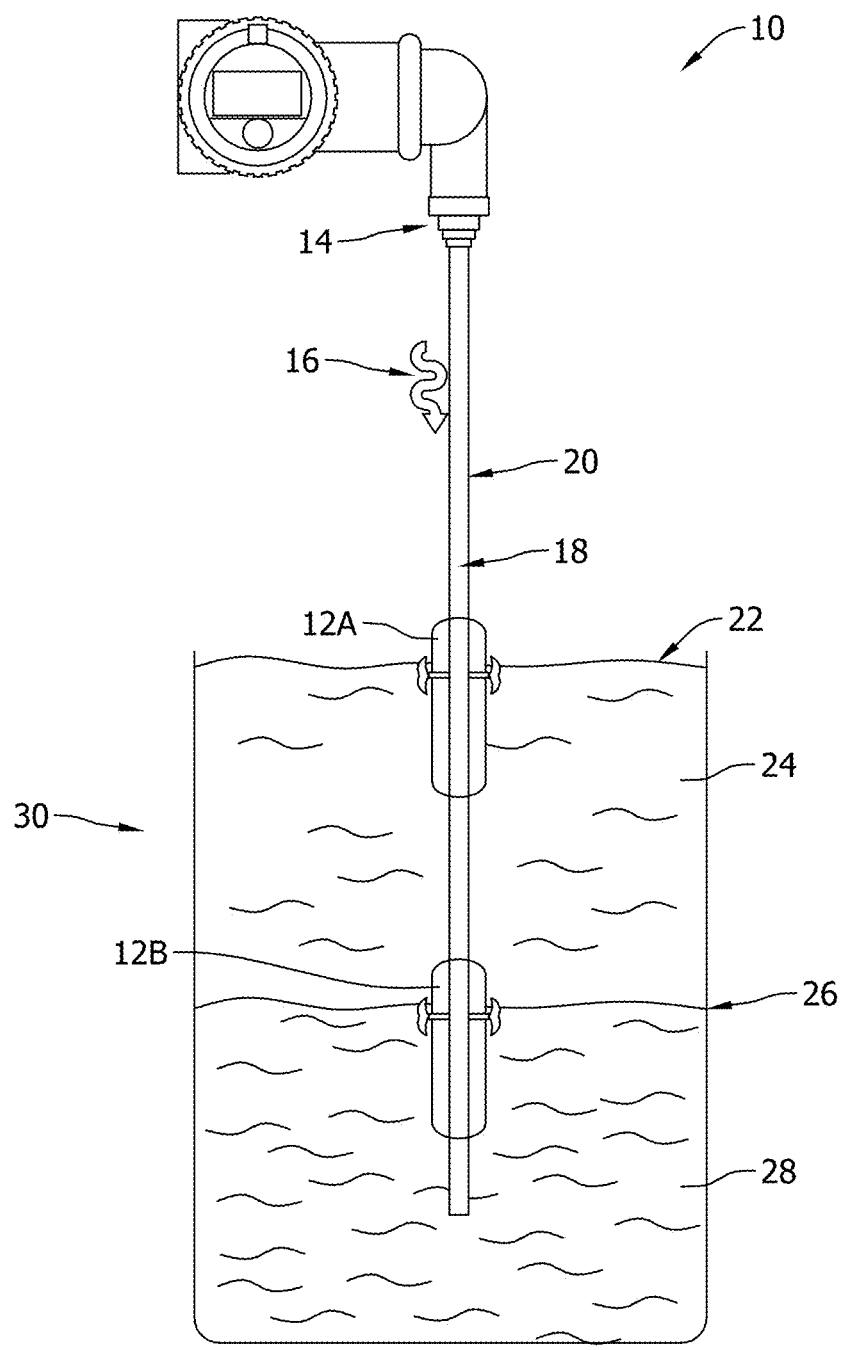
FIG. 1 is a simplified diagram illustrating the principle of operation of a magnetostrictive level transmitter.

Referring now to FIG. 1, the principle of operation of a magnetostrictive level transmitter 10 is illustrated in a simplified diagram. At a high level, the magnetostrictive level transmitter operates by measuring a time of flight of a torsional wave between a magnetic float 12 and a sensing element 14, which is then converted into a distance. The illustrative magnetostrictive level transmitter 10 shown in FIG. 1 includes two magnetic floats 12A and 12B. The magnetic float 12A is configured to float at an upper surface 22 of a liquid 24 held in a tank 30, while the magnetic float 12B is configured to float at an interface 26 between the liquid 24 and a liquid 28 also held in the tank 30. It is contemplated that other types of magnetic floats 12 can be used in other embodiments.

In operation, an electronic circuit in the transmitter 10 generates a current pulse 16 (e.g., at fixed intervals) which travels down a specialized wire 18 inside the sensor tube 20 at near the speed of light, creating a magnetic field around the wire 18. The interaction of the magnetic field around the wire 18 and the magnetic float 12A or 12B causes a torsional stress wave to be induced in the wire 18. This torsional stress wave propagates along the wire 18 at a known velocity, from the position of the magnetic float 12A or 12B toward the sensing element 14 in the transmitter 10. The sensing element 14 converts the received mechanical torsion into an electrical return pulse that is used to measure the elapsed time between the start and return pulses (time of flight). The measured time of flight is then converted it into a value representing a level, an interface, an empty distance, a volume, a position or simply a distance, depending of the requirements of the application. Throughout the present disclosure, the term "distance" will be used to encompass any such value, including a level of fluid, an interface level, an empty distance, a volume, a position, or a distance.

The present disclosure provides a unique signal conditioning circuit for magnetostrictive transmitters. The presently disclosed signal conditioning circuit includes several hardware features configured to process the signal from the magnetostrictive sensor and to reduce noise at the same time. Furthermore, the present disclosure provides software (which may be embodied as firmware on the transmitter and/or software on a personal computer (PC) or control system, all referred to as "software" in the present disclosure) that is configured to readapt the hardware of the signal conditioning circuit to specific conditions. Additionally, the presently disclosed software can evaluate data received from the signal conditioning circuit to determine the value of the process variable being monitored by the magnetostrictive transmitter and can perform deep processing and analysis of system parameters to raise diagnostic messages if certain diagnostic criteria are met. The software may also display the waveform of the signal in a human-machine interface (HMI) display to assist with identification of any problem and adequate reconfiguration of the transmitter for optimal performance given the conditions of the application. Additionally, the systems and methods of the present disclosure provide flexibility to easily change a mounting configuration, a sensor type, and/or a sensor size of the magnetostrictive transmitter, while utilizing the same hardware.

Figure 2:
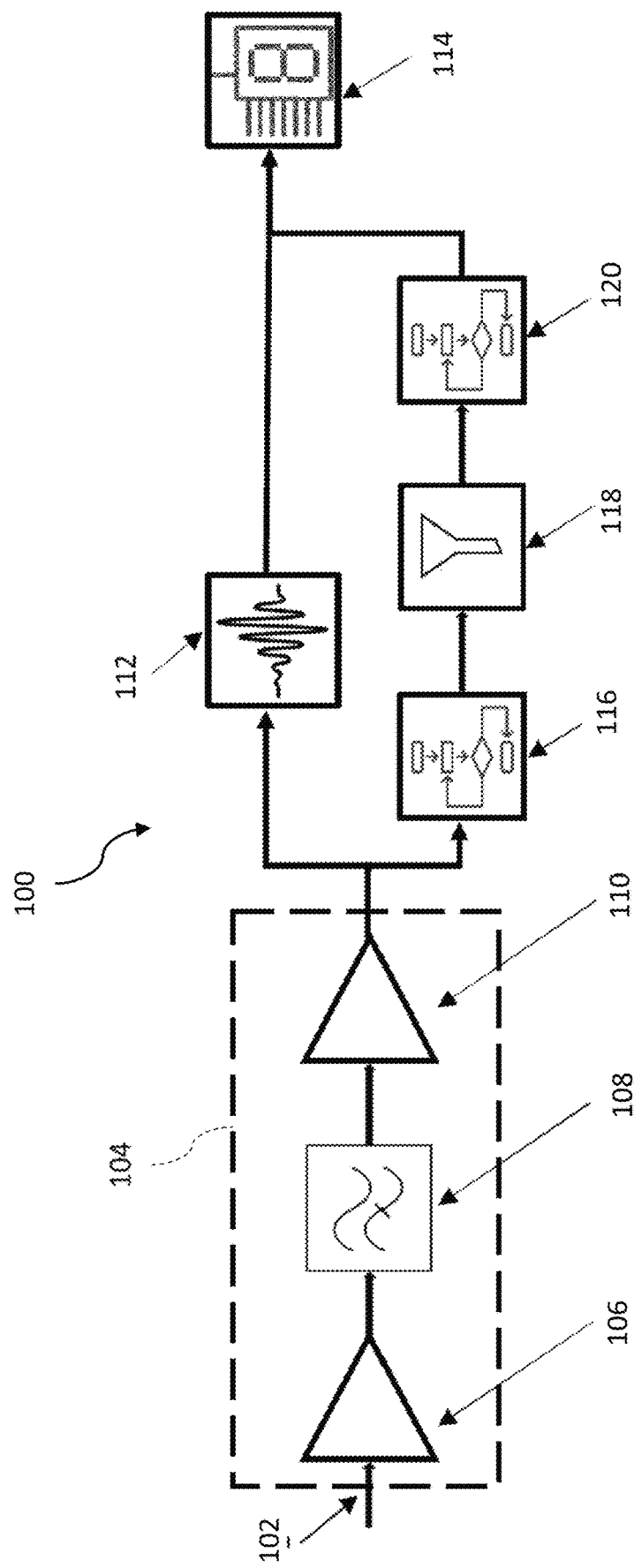
FIG. 2 is a simplified block diagram illustrating a signal conditioning circuit according to at least one embodiment of the present disclosure.

Referring now to FIG. 2, one illustrative embodiment of a signal conditioning circuit 100 according the present disclosure is shown as a simplified block diagram. This simplified block diagram illustrates the path of a return signal 102, received from the magnetostrictive sensor, as it is processed by the signal conditioning circuit 100. In operation, the return signal 102 from the magnetostrictive sensor is fed to an analog section 104 of the signal conditioning circuit 100. This analog section 104 includes an instrumentation amplifier 106 with high-common noise rejection, an active high pass filter 108 with constant group delay, and an additional amplifier stage 110 with a wide range of variable gain.

After amplification in the analog section 104 of the signal conditioning circuit 100, the signal is sampled with an analog-to-digital converter (ADC) 112 and then plotted in an HMI display 114. The HMI display 114 may be part of the magnetostrictive transmitter 10, or part of an associated the control system (in which case the data representing the sampled signal may be transmitted using the appropriate communication drivers).

In parallel to the sampling by the ADC 112, the signal is processed by a distance detection module 116. In the illustrative embodiment, the distance detection module includes programmable logic configured to implement a distance detection algorithm. The data output by the distance detection module 116 (e.g., from the distance detection algorithm) is then passed to a median filter 118 and a diagnostic algorithm 120, both of which are illustratively embodiment in software. The median filter 118 is configured to remove spikes from the measurement.

The diagnostic algorithm 120 validates the resulting data and can send one or more diagnostic messages to the HMI display 114, as needed. In particular, the diagnostic algorithm 120 evaluates both raw and filtered data for key parameters and diagnostic patterns, raising diagnostic messages or alarm conditions when certain diagnostic criteria are met (or not met). In the illustrative embodiment, the diagnostic messages that may be displayed on the HMI display 114 include: "Level Not Detected", "Level Sensor Stuck", "Level Sensor Out of Range", and "Level Out of Limits". In other words, if any problems are detected by the software (e.g., by the diagnostic algorithm 120), the HMI display 114 presents the diagnostic message(s) to a user, while also allowing the user to review the signal waveform for identification of the root cause. Proper adjustments can then be made to the signal conditioning circuit 100 to improve the quality of the measurement. In some embodiments, once the software of the signal conditioning circuit 100 has processed the return signal 102 and determined the characteristics of the noise produced by vibration or electromagnetic sources, the software can apply the necessary adjustments to the signal conditioning circuit 100 to reduce the impact of those factors on the integrity of the measurement.

Figure 3:
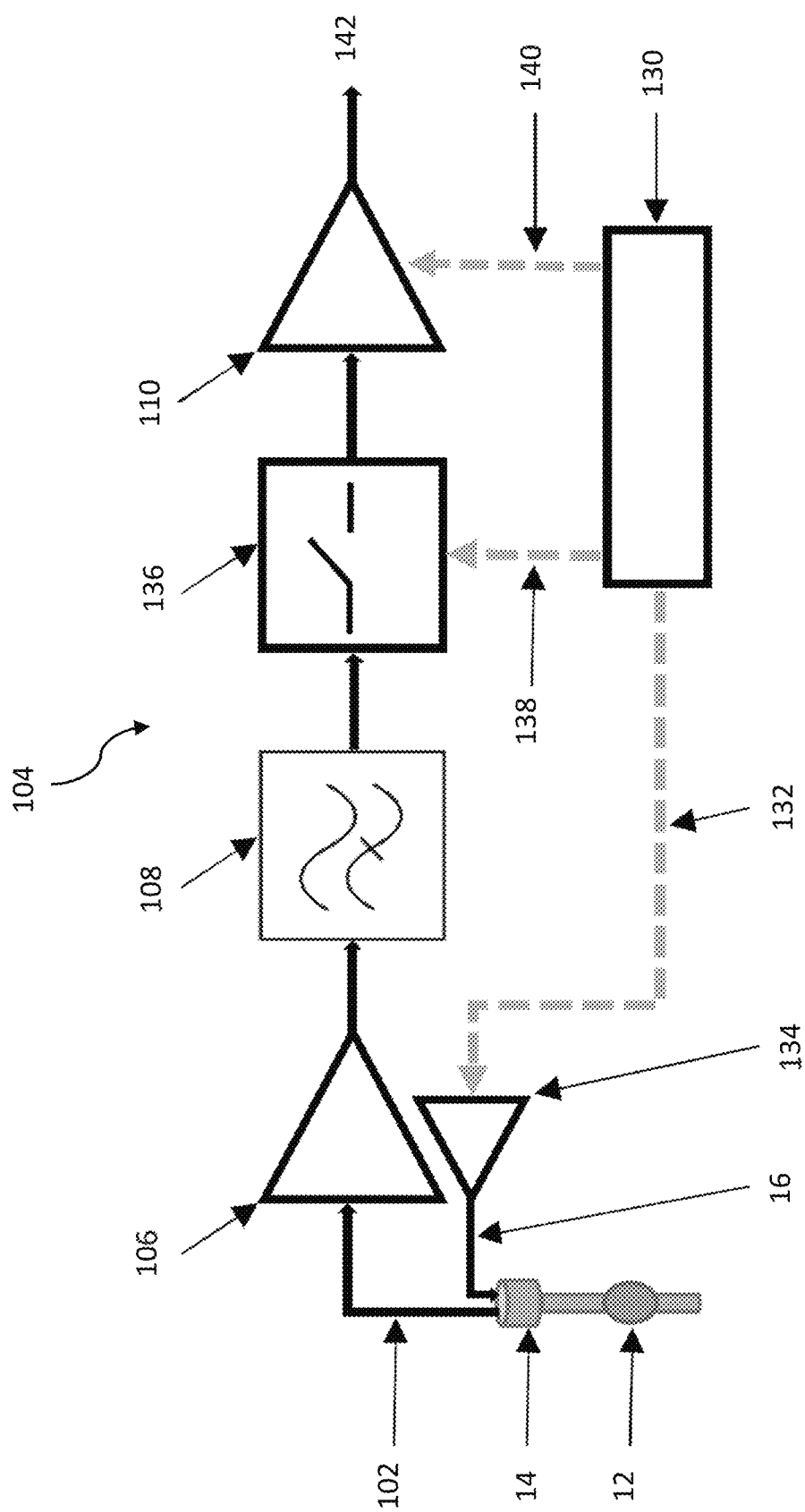
FIG. 3 is a more detailed block diagram of at least one embodiment of an analog section of the signal conditioning circuit of FIG. 2.

FIG. 3 shows a more detailed block diagram of one illustrative embodiment of the analog section 104 of the signal conditioning circuit 100. As discussed above, the magnetostrictive sensor is usually fitted with one or more floats 12 with built-in magnets to measure distance inside a tank 30 (or other vessel). Those skilled in the art will appreciate that, in other embodiments, the magnetostrictive transmitter 10 can be used with standalone magnets secured to other moving objects to measure distance.

In operation, a programmable control circuit 130 (e.g., a microcontroller) sends an appropriate control signal 132 to cause a pulsing circuit 134 to send a current pulse 16 with a specified energy level to the magnetostrictive sensor. As described above with reference to FIG. 1, application of the current pulse 16 results in a return signal 102. The return signal 102 from the sensing element 14 is passed into the instrumentation amplifier 106, which provides amplification of the signal with low direct current (DC) offset, low drift, and a high common mode rejection ratio (CMRR) and a high power supply rejection ratios (PSRR). Thus, the instrumentation amplifier 106 rejects much of the electrical noise injected to the return signal 102.

From the instrumentation amplifier 106 the signal is routed into active high pass filter 108 with constant group delay. In the illustrative embodiment, the filter 108 is embodied as a constant group delay Bessel filter optimized to have a normalized transfer function of up to −80 dB at 50 Hz and −54 dB at 500 Hz. This enables the signal conditioning circuit 100 to effectively reject electromagnetic noise produced by electrical machines and most of the vibration noise produced in the low frequency range below 1 KHz.

While the instrumentation amplifier 106 and the filter 108 are able to reject low frequency noise well, they do not eliminate noise in the same frequency range as the return signal 102. To reduce such noise, and thereby increase the signal to noise ratio, the programmable control circuit 130 configures and controls components of the analog section 104 of the signal conditioning circuit 100, including the pulsing circuit 134, a polarity selection circuit 136, and the additional amplifier stage 110 in accordance with a noise reduction algorithm.

From the output of the filter 108, the signal is transferred to the polarity selection circuit 136, which includes a plurality of analog switches controllable by the programmable control circuit 130 (via one or more control signals 138) to switch a polarity of the received signal, as necessary, into the required polarity for proper operation of the signal conditioning circuit 100. The ability of the polarity selection circuit 136 to adjust signal polarity allows the magnetostrictive transmitter 10 to be installed and used in both a top to bottom orientation and a bottom to top orientation, as well as using any type of magnetic float 12. This feature provides flexible field configurability, which can result in significant shipping, service, and commissioning costs.

From the output of the polarity selection circuit 136, the signal is transferred to the additional amplifier stage 110 with a wide range of variable gain. The variable gain of the additional amplifier stage 110 is controllable by the programmable control circuit 130 (via one or more control signals 140). In the illustrative embodiment, the additional amplifier stage 110 provides up to 48 dB of dynamic range. Furthermore, in the illustrative embodiment, the maximum total gain of the analog section 104 of the signal conditioning circuit 100 is approximately 90 dB for frequencies between 17 KHz and 40 KHz, allowing amplification of very small signals but also, importantly, attenuation down to −90 db on signals or noise produced in the 50-60 Hz range. The signal 142 output by the analog section 104 is the provide, in parallel, to both the ADC 112 and the distance detection module 116, as described above with reference to FIG. 2.

Figure 4:
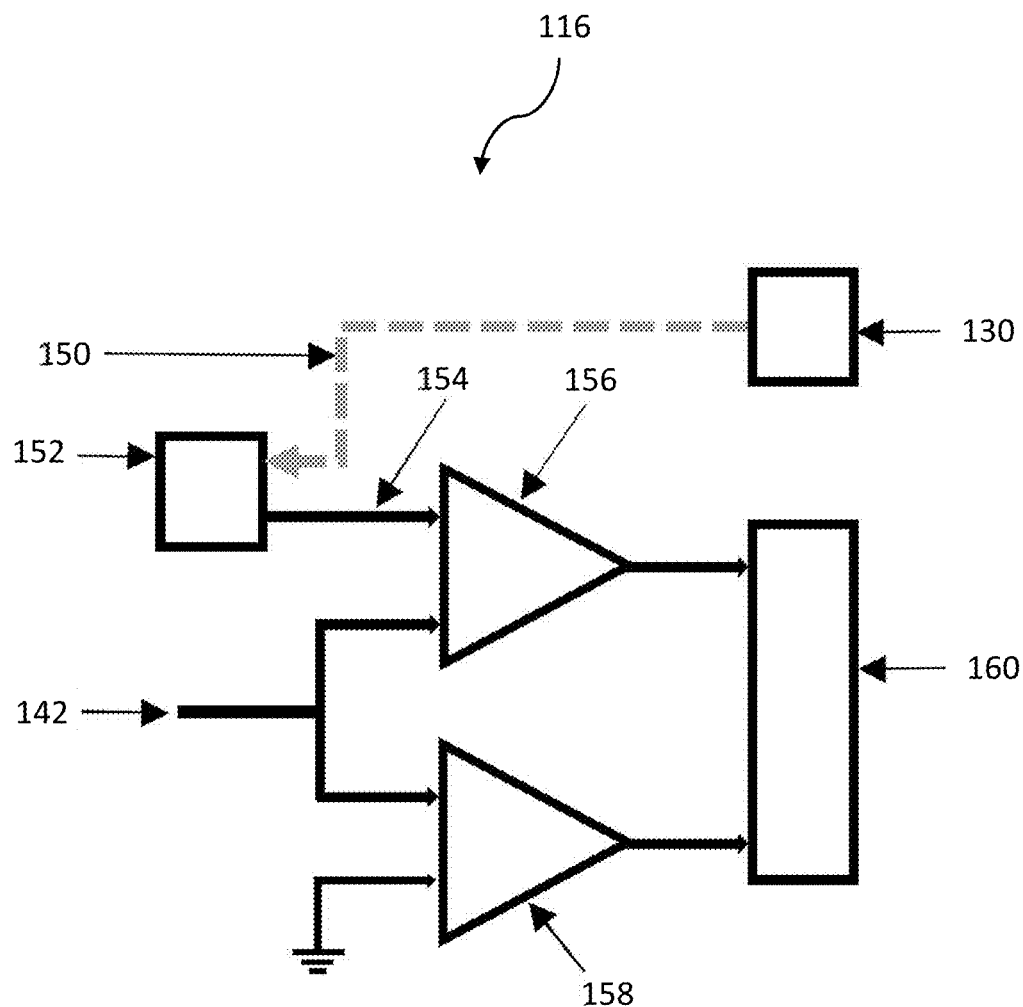
FIG. 4 is a more detailed block diagram of at least one embodiment of a distance detection module of the signal conditioning circuit of FIG. 2.

FIG. 4 shows a more detailed block diagram of one illustrative embodiment of the distance detection module 116 of the signal conditioning circuit 100. As shown in FIG. 4, the programmable control circuit 130 sends a control signal 150 to a threshold circuit 152 to configure the threshold circuit 152 with the signal level desired to be ignored as noise. In response, the threshold circuit 152 generates a threshold voltage 154 that is fed to a threshold crossing detector 156 for comparison to the signal 142 output by analog section 104 of the signal conditioning circuit 100. The signal 142 is simultaneously fed to a zero crossing detector 158. The outputs of both the threshold crossing detector 156 and the zero crossing detector 158 are passed to a distance detecting circuit 160, which validates the correct event and timing sequences and then determines the measured time of flight (representative of a measured distance, as discussed above). The adjustable threshold voltage 154, generated by the threshold circuit 152 (under control of the programmable control circuit 130) and fed to the threshold crossing detector 156, provide an efficient mechanism for ignoring noise below the threshold voltage 154, independently of the source of the noise.

Figure 5:
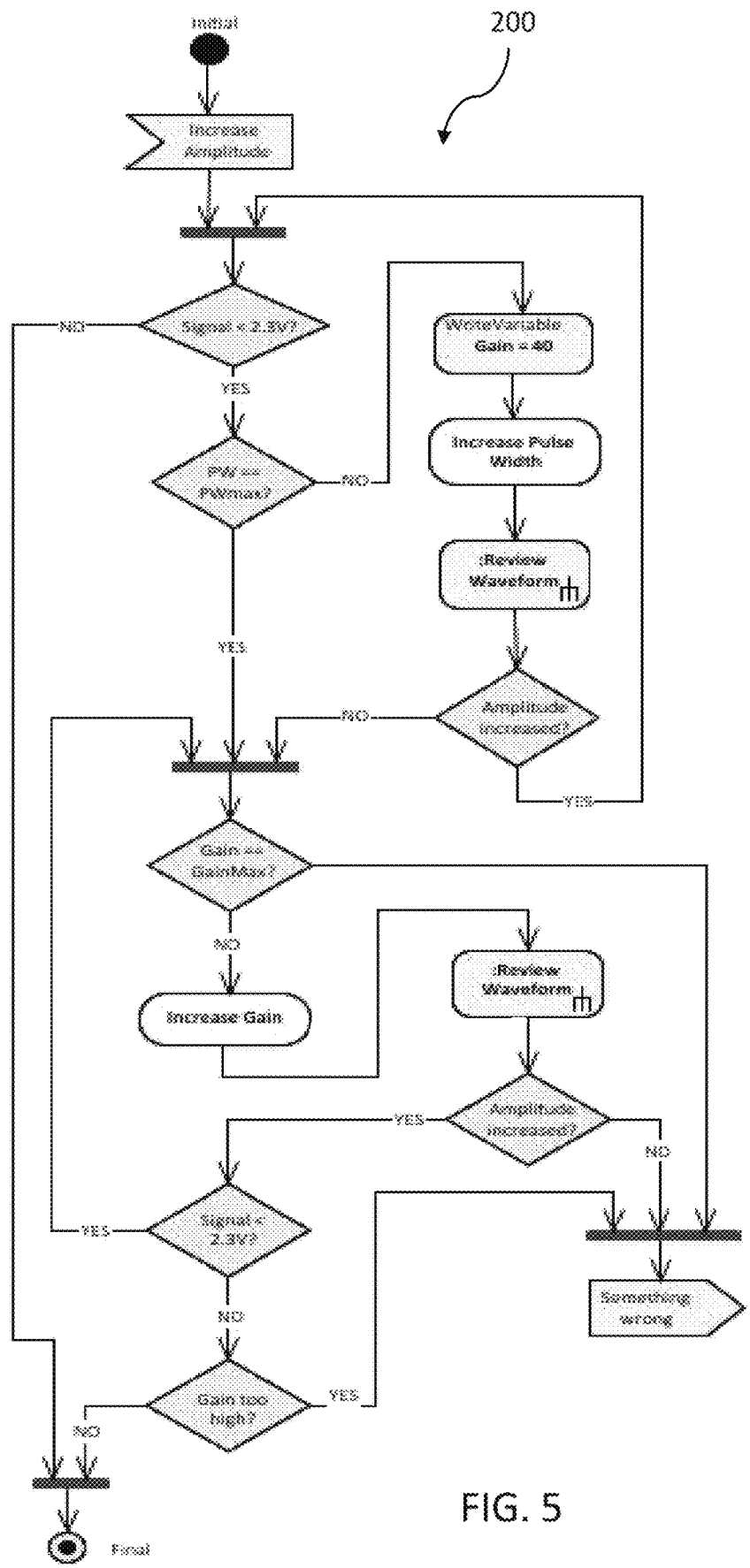
FIG. 5 is a simplified block diagram illustrating a configuration procedure according to at least one embodiment of the present disclosure.

Referring now to FIG. 5, an illustrative configuration procedure 200 for the signal conditioning circuit 100 of the magnetostrictive level transmitter 10 is shown as a simplified block diagram. The configuration procedure 200 can be performed by the programmable control circuit 130 by configuring and controlling various aspects of the signal conditioning circuit 100 and by observing the resulting noise and signal information from the circuit 100 (including, for example, the signal 142 output by the analog section 104 of the signal conditioning circuit 100).

The configuration procedure 200 begins by determining an appropriate energy level for the current pulse 16 to be sent down the wire 18 inside the sensor tube 20 of the transmitter 10. To do so, the programmable control circuit 130 sends a first control signal 132 that causes the pulsing circuit 134 to apply a current pulse 16 and then observes the resulting signal 142 output by the analog section 104. Next, the programmable control circuit 130 sends a second control signal 132 that causes the pulsing circuit 134 to apply a current pulse 16 with increased energy and then observes the resulting signal 142. If the signal 142 has increased amplitude as a result of the increased energy current pulse 16 and has not saturated, this cycle is repeated (i.e., a third current pulse 16 of even greater energy is applied and the resulting signal 142 is observed, and so on). Once the signal 142 saturates, the energy of the current pulse 16 is reduced to the amount from the previous cycle (i.e., the last cycle without saturation of the signal 142), and the configuration procedure 200 moves to the next step.

Next, the configuration procedure 200 configures the gain settings of the analog section 104 of the signal conditioning circuit 100. To do so, the programmable control circuit 130 repeatedly applies the control signal 132 (determined above) to cause the pulsing circuit 134 to apply the current pulse 16, while adjusting the variable gain of the additional amplifier stage 110 via one or more control signals 140 and observing the resulting signals 142 output by the analog section 104. The programmable control circuit 130 increases the variable gain of the additional amplifier stage 110 until saturation is observed and then sets the variable gain of the additional amplifier stage 110 as high as possible without saturation.

Finally, the configuration procedure 200 configures the distance detection module 116 of the signal conditioning circuit 100. To do so, the programmable control circuit 130 determines the highest amplitude peaks in both the observed signals 142 and any noise present and calculates a value that is midway (50%) between those peaks. The programmable control circuit 130 then sends an appropriate control signal 150 to the threshold circuit 152 to cause the threshold circuit 152 to generate a threshold voltage 154 with the calculated value (i.e., midway between the highest amplitude peaks of signal and noise). As discussed above with reference to FIG. 4, this threshold voltage 154 is the fed to the threshold crossing detector 156 for comparison to the signal 142, and the output of the threshold crossing detector 156 is used by the distance detecting circuit 160 to ignore unwanted noise, regardless of source. As such, the configuration procedure 200 can effectively reduce the noise generated by vibration harmonics or other low frequency noise, because increasing the energy of current pulse 16 increases the amplitude of the signal without increasing the amplitude of the noise.

The embodiment(s) detailed above may be combined in full or in part, with any alternative embodiment(s) described.

INDUSTRIAL APPLICABILITY

The above disclosure represents an improvement in the art by providing an advanced analog circuit highly integrated with programmable devices and software to provide effective analog and digital processing of signals from magnetostrictive sensors. The above disclosure further represents an improvement in the art by providing a configuration procedure to achieve the optimal performance of the foregoing system in noisy environments, especially targeting electrical and vibration noise.

While some implementations have been illustrated and described, numerous modifications come to mind without significantly departing from the spirit of the disclosure, and the scope of protection is only limited by the scope of the accompanying claims.

To the extent that the terms include, have, or the like is used, such terms are intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The disclosed systems and methods are well adapted to attain the ends and advantages mentioned as well as those that are inherent therein. The particular implementations disclosed above are illustrative only, as the teachings of the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative implementations disclosed above may be altered, combined, or modified and all such variations are considered within the scope of the present disclosure. The systems and methods illustratively disclosed herein may suitably be practiced in the absence of any element that is not specifically disclosed herein and/or any optional element disclosed herein.

It should be understood that the described instructions, operations, and systems can generally be integrated together in a single software/hardware product or packaged into multiple software/hardware products.

The use of the terms "a" and "an" and "the" and "said" and similar references in the context of describing the subject matter of the present disclosure (especially in the context of the following claims) are to be construed to cover both the singular and the plural, unless otherwise indicated herein or clearly contradicted by context. An element proceeded by "a," "an," "the," or "said" does not, without further constraints, preclude the existence of additional same elements. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

What is claimed is:

1. A signal conditioning circuit comprising:
   a pulsing circuit configured to generate a current pulse;
   an instrumentation amplifier configured to receive and amplify an analog measurement signal resulting from the current pulse;
   an active high pass filter configured to reduce noise in a signal output by the instrumentation amplifier;
   a variable gain amplifier stage configured to further amplify a signal output by the active high pass filter;
   a distance detection module configured to process a signal output by the variable gain amplifier stage to determine a distance measurement associated with the analog measurement signal received by the instrumentation amplifier; and
   a programmable control circuit configured to control an energy level of the current pulse and a gain level of the variable gain amplifier stage and to receive data concerning the signal output by the variable gain amplifier stage, including the distance measurement, from the distance detection module, wherein the programmable control circuit is further configured to control the pulsing circuit to iteratively repeat generating the current pulse, while incrementally increasing the energy level of the current pulse, until saturation is observed in the signal output by the variable gain amplifier stage.

2. The signal conditioning circuit of claim 1, further comprising an analog-to-digital converter (ADC) configured to sample the signal output by the variable gain amplifier stage to generate a digitized measurement signal.

3. The signal conditioning circuit of claim 2, further comprising a human-machine interface configured to display a plot of the digitized measurement signal.

4. The signal conditioning circuit of claim 2, wherein the programmable control circuit is further configured to receive the digitized measurement signal from the ADC.

5. The signal conditioning circuit of claim 1, wherein the programmable control circuit is further configured to implement a median filter to remove spikes from the distance measurement.

6. The signal conditioning circuit of claim 1, wherein the programmable control circuit is further configured to apply a diagnostic algorithm to the data received from the distance detection module, wherein the diagnostic algorithm generates diagnostic messages in response to determining that diagnostic criteria are met.

7. The signal conditioning circuit of claim 6, further comprising a human-machine interface configured to display the diagnostic messages generated by the diagnostic algorithm of the programmable control circuit.

8. The signal conditioning circuit of claim 1, wherein the programmable control circuit is further configured to set the gain level of the variable gain amplifier stage after the generating of the current pulse.

9. A magnetostrictive transmitter comprising:
   the signal conditioning circuit of claim 8;
   a sensor tube containing a wire, wherein the current pulse generated by the pulsing circuit travels along the wire;
   a magnetic float configured to move along the sensor tube and to induce a torsional stress wave in the wire in response to a magnetic field created by the current pulse travelling along the wire; and
   a sensor configured to generate the analog measurement signal in response to the torsional stress wave.

10. The signal conditioning circuit of claim 1, wherein the active high pass filter is a Bessel filter with a normalized transfer function of up to −80 dB at 50 Hz and −54 dB at 500 Hz.

11. The signal conditioning circuit of claim 1, further comprising a polarity selection circuit configured to selectively switch a polarity of the signal output by the active high pass filter, in response to control signals from the programmable control circuit, before that signal is provided to the variable gain amplifier stage.

12. The signal conditioning circuit of claim 1, wherein the variable gain amplifier stage provides up to 48 dB of dynamic range.

13. The signal conditioning circuit of claim 1, wherein the instrumentation amplifier, the active high pass filter, and the variable gain amplifier stage collectively provide gain up to 90 dB for frequencies between 17 KHz and 40 KHz and attenuation down to −90 db for frequencies between 50 Hz and 60 Hz.

14. The signal conditioning circuit of claim 1, wherein the distance detection module comprises:
   a threshold circuit configured to generate a threshold voltage in response to a control signal received from the programmable control circuit;
   a threshold crossing detector configured to compare the signal output by the variable gain amplifier stage to the threshold voltage;
   a zero crossing detector configured to compare the signal output by the variable gain amplifier stage to ground; and a distance detecting circuit configured to determine the distance measurement using signals output by the threshold crossing detector and the zero crossing detector.

15. The signal conditioning circuit of claim 14, wherein the programmable control circuit is further configured to adjust the control signal sent to the threshold circuit such that the threshold voltage is set midway between (i) a highest amplitude in the signal output by the variable gain amplifier stage representing signal of interest and (ii) a highest amplitude in the signal output by the variable gain amplifier stage representing noise.

16. A method of configuring a magnetostrictive level transmitter, the method comprising:
- transmitting a current pulse along a wire to cause a magnetic float to induce a torsional stress wave in the wire in response to a magnetic field created by the current pulse;
- generating an analog measurement signal in response to the torsional stress wave;
- amplifying the analog measurement signal to produce an amplified measurement signal;
- iteratively repeating the transmitting, generating, and amplifying steps while incrementally increasing an energy level of the current pulse, until saturation is observed in the amplified measurement signal; and
- setting the energy level of the current pulse at a highest value that did not cause saturation in the amplified measurement signal.

17. The method of claim 16, further comprising, after setting the energy level of the current pulse:
- iteratively repeating the transmitting, generating, and amplifying steps while incrementally increasing a gain level of a variable gain amplifier stage used to amplify the analog measurement signal, until saturation is observed in the amplified measurement signal; and
- setting the gain level of the variable gain amplifier stage at a highest value that did not cause saturation in the amplified measurement signal.

18. The method of claim 17, further comprising:
- generating a threshold voltage that is midway between (i) a highest amplitude in the amplified measurement signal that represents signal of interest and (ii) a highest amplitude in the amplified measurement signal that represents noise; and
- comparing the amplified measurement signal to threshold voltage using a threshold crossing detector to filter out the noise from the signal of interest when determining a distance represented by the analog measurement signal.

* * * * *